(12) United States Patent
Blanquart

(10) Patent No.: US 12,341,003 B2
(45) Date of Patent: Jun. 24, 2025

(54) METHOD AND SYSTEM FOR FORMING MATERIAL WITHIN A GAP

(71) Applicant: ASM IP Holding B.V., Almere (NL)

(72) Inventor: Timothee Blanquart, Oud-Heverlee (BE)

(73) Assignee: ASM IP Holding B.V., Almere (NL)

( * ) Notice: Subject to any disclaimer, the term of this patent is extended or adjusted under 35 U.S.C. 154(b) by 398 days.

(21) Appl. No.: 17/953,518

(22) Filed: Sep. 27, 2022

(65) Prior Publication Data

US 2023/0099607 A1 Mar. 30, 2023

Related U.S. Application Data

(60) Provisional application No. 63/250,316, filed on Sep. 30, 2021.

(51) Int. Cl.
*H01L 21/02* (2006.01)
(52) U.S. Cl.
CPC .. *H01L 21/02263* (2013.01); *H01L 21/02008* (2013.01); *H01L 21/02255* (2013.01); *H01L 21/02321* (2013.01)

(58) Field of Classification Search
None
See application file for complete search history.

(56) References Cited

U.S. PATENT DOCUMENTS

| | | | |
|---|---|---|---|
| 2012/0149213 A1* | 6/2012 | Nittala | H01L 21/67207 257/E21.24 |
| 2015/0125791 A1* | 5/2015 | Somervell | G03F 7/2024 430/323 |
| 2018/0261502 A1* | 9/2018 | Tan | H01L 21/288 |
| 2019/0258128 A1* | 8/2019 | Mansky | B05D 1/18 |
| 2020/0013626 A1* | 1/2020 | Longrie | H01L 21/32051 |
| 2020/0357694 A1* | 11/2020 | Chou | H01L 21/76843 |
| 2021/0175073 A1* | 6/2021 | Ryu | C07C 211/08 |

* cited by examiner

*Primary Examiner* — Khaja Ahmad
(74) *Attorney, Agent, or Firm* — Snell & Wilmer L.L.P.

(57) ABSTRACT

A method and system for forming material within a gap on a surface of a substrate are disclosed. An exemplary method includes depositing a soluble layer on a surface of the substrate and exposing the soluble layer to a solvent to thereby form solvated material within the gap. Exemplary methods can further include drying the solvated material and/or converting the solvated or dried material to another material.

20 Claims, 3 Drawing Sheets

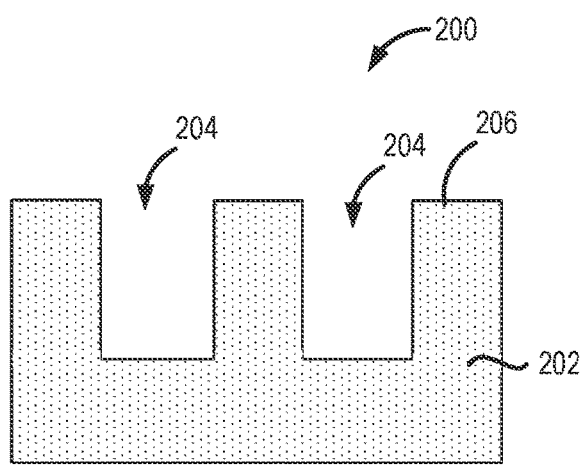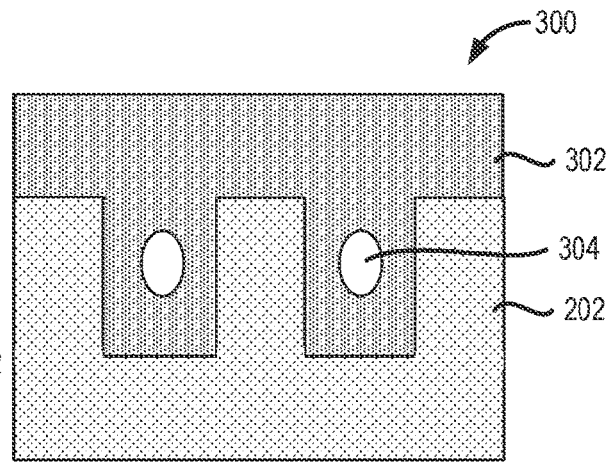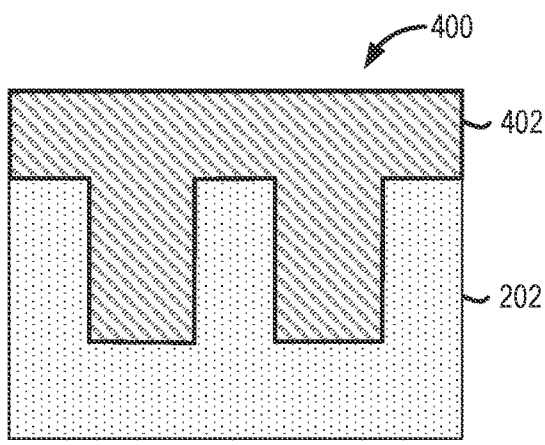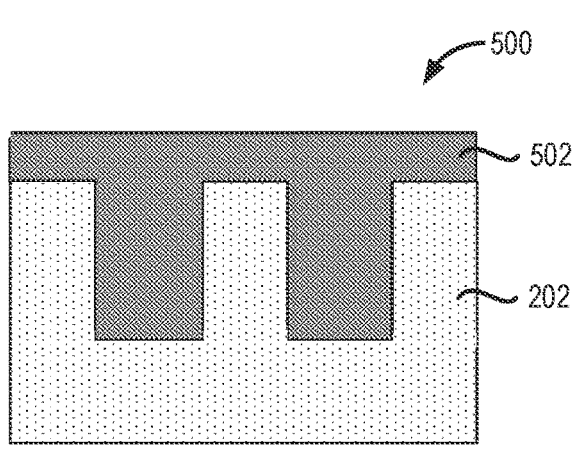
FIG. 2
FIG. 3
FIG. 4
FIG. 5
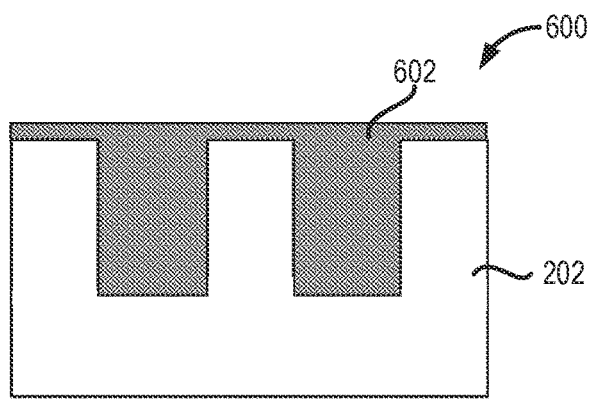
FIG. 6

METHOD AND SYSTEM FOR FORMING MATERIAL WITHIN A GAP

CROSS-REFERENCE TO RELATED APPLICATIONS

This application claims priority to U.S. Provisional Patent Application Ser. No. 63/250,316, filed Sep. 30, 2021, and titled METHOD AND SYSTEM FOR FORMING MATERIAL WITHIN A GAP, the disclosure of which is hereby incorporated by reference in its entirety.

FIELD OF DISCLOSURE

The present disclosure generally relates to methods and systems used in the formation of electronic devices. More particularly, the disclosure relates to methods and systems suitable for at least partially filling gaps on a surface of a substrate during the manufacture of devices.

BACKGROUND OF THE DISCLOSURE

The scaling of semiconductor devices has led to significant improvements in speed and density of integrated circuits. However, conventional device scaling techniques face significant challenges for future technology nodes. In particular, with miniaturization device features, void-free filling of high aspect ratio gaps (e.g., having an aspect ratio of three or higher) with material becomes increasingly challenging due to limitations of existing deposition processes.

While some techniques have been developed to provide material within a gap, such methods may not provide desired material within the gap in a seamless and/or void-free manner. Accordingly, improved methods and systems for forming material within a gap, while mitigating void and/or seam formation within the material, are desired.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to necessarily limit the scope of the claimed subject matter.

Various embodiments of the present disclosure relate to methods and systems for providing material within a gap—e.g., at least partially filling the gap with desired material. As set forth in more detail below, exemplary methods include forming a soluble layer of material on a surface of a substrate and dissolving at least a portion of the soluble layer to form solvated material within the gap.

In accordance with embodiments of the disclosure, methods of forming material within a gap are provided. Exemplary methods include providing the substrate within a gas-phase reaction chamber of a reactor, depositing a soluble layer on the surface of the substrate, and exposing the soluble layer to a solvent to thereby form solvated material within the gap. In accordance with further examples of the disclosure, the method includes a step of removing solvent from the solvated material to form dried material. The solvent can be removed within the reaction chamber or another reaction chamber by, for example, increasing a temperature of the substrate and/or reducing a temperature within the reaction chamber. In accordance with further examples of the disclosure, the method includes a step of exposing the dried material to a converting reactant to form converted material. The converting reactant can include, for example, one or more of a nitriding reactant, an oxidizing reactant, and a reducing reactant. The soluble layer can include a halogen, such as one or more of fluorine, chlorine, bromine, and iodine. For example, the soluble layer can include a metal halide, such as a metal halide having a general formula represented as $MX_y$, where M is a metal (e.g., a group 1 to group 12 metal), X is a halogen, and y ranges from about 1 to about 5. The soluble layer can be formed in a variety of ways, such as chemical vapor deposition (CVD), plasma-enhanced CVD (PECVD), pulsed PECVD, physical vapor deposition (PVD), atomic layer deposition (ALD), plasma-enhanced ALD (PEALD), or the like.

In accordance with further examples of the disclosure, a structure is provided. The structure includes a substrate including a gap and material formed within the gap. The material can include material formed according to a method as described herein.

In accordance with additional embodiments of the disclosure, a reactor system is provided. An exemplary reactor system includes a reactor comprising a reaction chamber, a soluble layer precursor source fluidly coupled to the reaction chamber, a solvent source fluidly coupled to the reaction chamber, and a controller configured to deposit a soluble layer on a surface of a substrate and expose the soluble layer to a solvent to form solvated material. The controller can be further configured to evaporate solvent from the solvated material to form dried material. Additionally or alternatively, the controller can be configured to expose the dried material to one or more of a nitriding reactant, an oxidizing reactant, and a reducing reactant.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

FIGS. 2-6 illustrate structures formed in accordance with examples of the disclosure.

Figure 1:
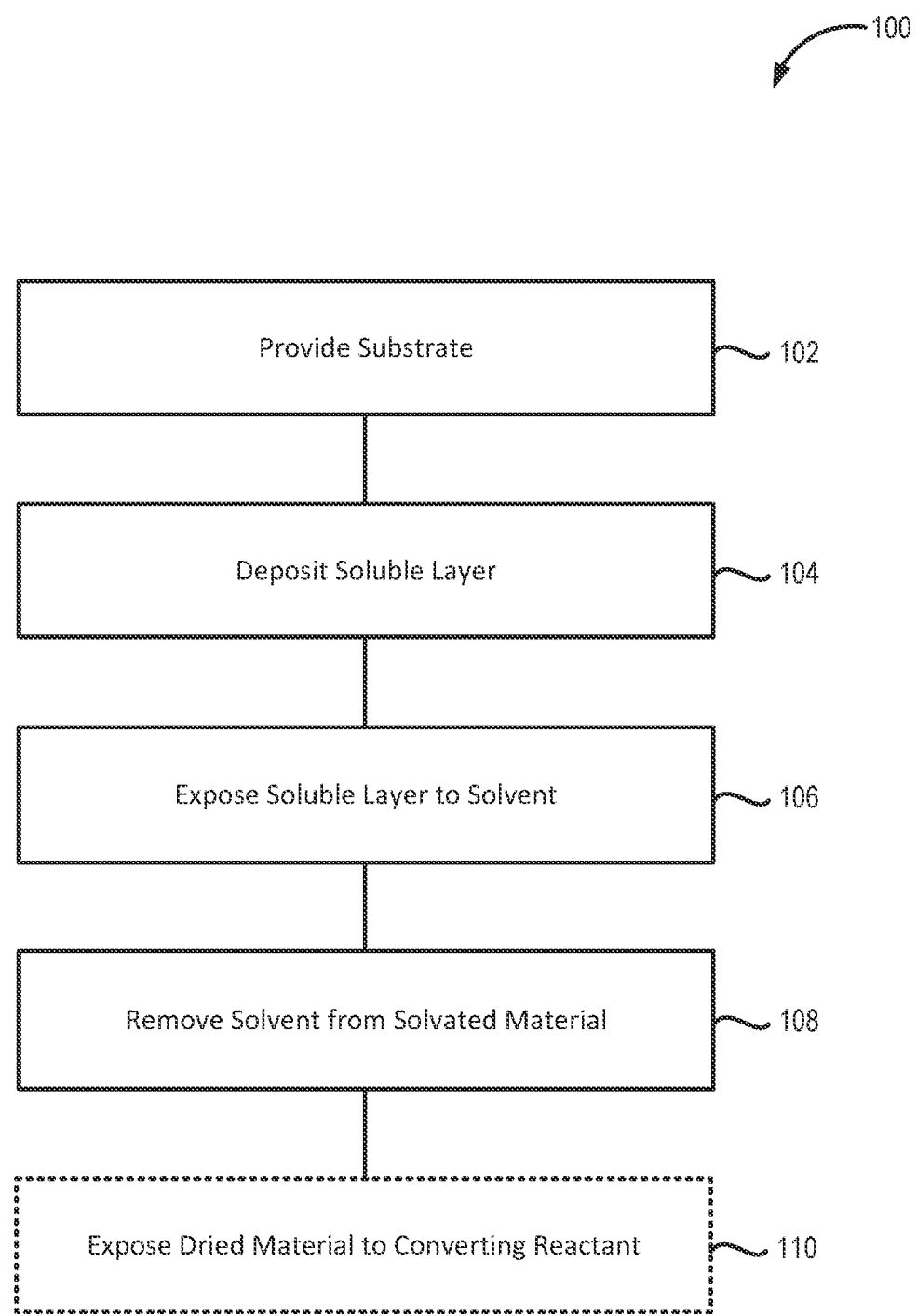
FIG. 1 illustrates a method in accordance with examples of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The present disclosure provides improved methods and systems for at least partially filling a gap with material. As set forth in more detail below, methods and systems described herein can be used to fill the gap with desired material in a void-free and/or seamless manner—e.g., from the bottom up.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas. Exemplary seal gases include noble gases, nitrogen, and the like. In some cases, the term "precursor" can refer to a compound that participates in the chemical reaction that produces another compound, and particularly to a compound that constitutes a film matrix or a main skeleton of a film; the term "reactant" can be used interchangeably with the term precursor. In some cases, a reactant reacts with a precursor or derivative thereof to form a film or layer.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may comprise, or may consist at least partially of, a plurality of dispersed atoms on a surface of a substrate. A film or layer may comprise material or a layer with pinholes and/or isolated islands. A film or layer may be at least partially continuous.

As used herein, a "structure" can be or can include a substrate as described herein. Structures can include one or more layers overlying the substrate, such as one or more layers formed according to a method as described herein.

The term "deposition process" as used herein can refer to the introduction of precursors, reactants, and/or other gases or reactive species into a reaction chamber to deposit or form a layer over a substrate. "Cyclical deposition processes" are examples of deposition processes.

The term "cyclic deposition process" or "cyclical deposition process" can refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

As used herein, the term "purge" may refer to a procedure in which an inert or substantially inert gas (which can include a non-activated reactant in some cases) is provided to a reaction chamber in between two pulses of gases that react with each other. For example, a purge, e.g., using a noble gas, may be provided between a precursor pulse and a reactant pulse, thus avoiding or at least reducing gas phase interactions between the precursor and the reactant. It shall be understood that a purge can be effected either in time or in space, or both. For example, in the case of temporal purges, a purge step can be used, e.g., in the temporal sequence of providing a first precursor to a reaction chamber, providing a purge gas to the reaction chamber, and providing a reactant to the reaction chamber, wherein the substrate on which a layer is deposited does not move. For example, in the case of spatial purges, a purge step can take the following form: moving a substrate from a first location to which a first precursor is continually supplied, through a purge gas curtain, to a second location to which a reactant is continually supplied.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

As used herein, the term "comprising" indicates that certain features are included, but that it does not exclude the presence of other features, as long as they do not render the claim or embodiment unworkable. In some embodiments, the term "comprising" includes "consisting of" or "consisting essentially of." As used herein, the term "consisting of" indicates that no further features are present in the apparatus/method/product apart from the ones following said wording. When the term "consisting of" is used referring to a chemical compound, it indicates that the chemical compound only contains the components which are listed.

In this disclosure, the term "filling capability" refers to a capability of filling a gap substantially without voids (e.g., no void having a size of approximately 5 nm or greater in diameter) and seams (e.g., no seam having a length of approximately 5 nm or greater), wherein seamless/void-less bottom-up growth of a layer is observed. The growth at a bottom of a gap may be at least approximately 1.5 times faster than growth on sidewalls of the gap and on a top surface having the gap. This disclosure provides methods and systems for forming material with filling capability, i.e., methods and system for filling gap from the bottom up.

In this disclosure, a recess between adjacent protruding structures and any other recess pattern may be referred to as a "gap." That is, a gap may refer to any recess pattern, including a hole/via, region between lines, and the like. A gap can have, in some embodiments, a width of about 20 nm to about 100 nm, and typically about 30 nm to about 50 nm. When a trench has a length that is substantially the same as its width, it can be referred to as a hole or a via. Holes or vias typically have a width of about 20 nm to about 100 nm. In some embodiments, a trench has a depth of about 30 nm to about 100 nm, and typically of about 40 nm to about 60 nm. In some embodiments, a gap has an aspect ratio of about 2 to about 10, and typically of about 2 to about 5. The dimensions of the gap may vary depending on process conditions, film composition, intended application, and the like.

As used herein, the term "height" may refer to the extent of a gap in a plane perpendicular to the surface of the substrate that comprises the gap in question.

As used herein, the term "width" may refer to the extent of a gap in a direction in a plane parallel to the surface of the substrate that comprises the gap in question.

As used herein, the term "length" may refer to the extent of a gap in a direction in a plane parallel to the surface of the substrate that comprises the gap in question. The directions in which the "width" and the "length" are measured are generally mutually perpendicular. It shall be understood that all dimensions, including length, width, and height of a structure, can be measured using routine techniques, such as scanning transmission electron microscopy (STEM).

Exemplary gaps include recesses, contact holes, vias, trenches, and the like. A gap generally comprises a distal part and a proximal part. The distal part comprises a distal surface. The proximal part comprises a proximal surface. It shall be understood that the gap does not necessarily have to be oriented vertically, but can extend in a horizontal direction. It shall be understood that the proximal part of the gap is the part of the gap that is closest to the substrate surface in which the gap forms a recess, and the distal part of the gap is the part of the gap that is most distant from that surface. A gap can include one or more sidewalls between the distal surface and the proximal surface.

In this disclosure, any defined meanings do not necessarily exclude ordinary and customary meanings in some embodiments.

Turning now to the figures, FIG. 1 illustrates a method 100 in accordance with examples of the disclosure. FIGS. 2-6 illustrate exemplary structures formed using method 100. As illustrated, method 100 includes the step of providing a substrate within a first reaction chamber (step 102), depositing a soluble layer on the surface of the substrate (step 104), and exposing the soluble layer to a solvent to thereby form solvated material within the gap (step 106). Method 100 can also include a step of removing solvent from the solvated material to form dried material (step 108) and/or a step of exposing the (e.g., dried) material to a converting reactant to form converted material (step 110). Although separately illustrated, various steps of method 100 can be combined or can overlap. For example, steps 108 and 110 can overlap in some cases. As used herein, overlap means performed within the same reaction chamber for a period of time.

As described in more detail below, various steps of method 100 can be performed within a gas-phase reactor system—e.g., within a single reactor system—e.g., within one or more reaction chambers of a single reactor system or cluster tool or process module. Exemplary reactor systems and reaction chambers are described in more detail below in connection with FIG. 7.

During step 102, a substrate comprising a gap is provided, e.g., into a reaction chamber of a reactor system. In accordance with examples of the disclosure, the reaction chamber can form part of a gas-phase reactor, such as a (e.g., plasma-enhanced) cyclical deposition reactor, such as a plasma-enhanced atomic layer deposition (PEALD) reactor, an atomic layer deposition (ALD) reactor, a chemical vapor deposition (CVD) reactor, a plasma-enhanced chemical vapor deposition (PECVD) reactor, a pulsed PECVD reactor, a physical vapor deposition reactor, or the like. A type of reactor can depend on the material deposited during step 104. A reactor can be provided with a heater and/or plasma apparatus to activate reactions within the reaction chamber.

During step 102, the substrate can be brought to a desired temperature and pressure for step 104. While the specific temperatures and pressures can depend on the material deposited, by way of examples, a temperature (e.g., of a substrate or a substrate support) within a reaction chamber can be between about 100° C. and about 1200° C. generally or about 400° C. and about 1200° C. for, for example, thermal processes; a pressure within the reaction chamber can be about $10^{-4}$ to about $10^5$ kPa generally. A structure 200, including a substrate 202 and gaps 204 formed therein, is illustrated in FIG. 2.

During step 104, a soluble layer is formed on a surface of the substrate within the reaction chamber. The soluble layer can be formed using any suitable process, such as PECVD, pulsed PECVD, ALD, PEALD, CVD, LPCVD, vacuum thermal evaporation, electron beam evaporation, laser beam evaporation, arc evaporation, molecular beam epitaxy, ion plating evaporation, direct current sputtering (DC sputtering), radio frequency sputtering (RF sputtering), sol-gel technique, chemical bath deposition, spray pyrolysis technique, plating, or the like. By way of example, the soluble layer can be formed using a cyclical process, such as PEALD or PECVD, in which one or more of a precursor and a reactant are activated using one or more of a remote plasma apparatus, a direct plasma apparatus, an indirect plasma apparatus, an ion beam, or the like. Step 104 can include providing a precursor comprising elements to be included in the soluble layer. In other words, step 104 can include providing a precursor comprising soluble layer material to the reaction chamber. In some cases, the precursor includes the same stoichiometry as the formed soluble layer. In some cases, the precursor consists of one or more metals and one or more halogens. When step 104 includes use of a plasma, the plasma may be formed using, for example, a noble gas (e.g., argon and/or helium), which can interact with the precursor to form the soluble layer. Alternatively, a PVD process can be used to deposit a soluble layer by using a target with the desired composition. Or, a precursor and a reactant can react—either in the gas phase and/or on a substrate surface to form the soluble layer. Table 1 below lists exemplary precursors suitable for CVD, PECVD, ALD, and/or PEALD. The precursors provided below are meant to be illustrative, and not restrictive, unless otherwise noted.

TABLE 1

| element | precursor |
|---------|-----------|
| Ir | $IrCl_4$ |
| Sr | $SrI_2$ |
| Co | $CoBr_2$ |
| Li | LiCl |
| Li | LiBr |
| Pr | $PrCl_3$ |
| Zn | $ZnCl_2$ |

The soluble layer can be or include one or more soluble materials. The soluble material is at least partially soluble in a solvent used during step 106. For example, the soluble material/soluble layer may exhibit a solubility of at least sparingly soluble, preferably at least soluble, most preferably at least freely soluble and even more preferably very soluble, as such levels are defined below in Table 2. The values in Table 2 can depend on, for example, a substrate temperature and a reaction chamber pressure. By way of example, a mass part of solvent to dissolve 1 mass part of the solute is less than 1000 at a substrate temperature and a pressure within the reaction chamber.

TABLE 2

| Term | Mass parts of solvent required to dissolve 1 mass part of solute |
|------|---|
| Very soluble | <1 |
| Freely soluble | 1 to 10 |
| Soluble | 10 to 30 |
| Sparingly soluble | 30 to 100 |
| Slightly soluble | 100 to 1,000 |
| Very slightly soluble | 1,000 to 10,000 |
| Practically insoluble or insoluble | ≥10,000 |

Exemplary suitable soluble materials comprise a halogen compound, such as a compound comprising one or more of fluorine (F), chlorine (Cl), bromine (Br), and iodine (I). For example, the soluble material can be or include a metal halide; such as a metal fluoride, a metal chloride, a metal bromide, or a metal iodide; or a compound comprising one or more metals and one or more halogens. Exemplary metals can be selected from group 1 to group 12 metals. For example, the metal can include one or more of iridium, strontium, cobalt, lithium, praseodymium, and zinc. By way of particular examples, the soluble layer can be or include one or more of $IrCl_4$, $SrI_2$, $CoBr_2$, LiCl, LiBr, $PrCl_3$, and $ZnCl_2$.

FIG. 3 illustrates a structure 300, with a soluble layer 302 deposited onto a surface 206 of substrate 202. In the illustrated example, layer 302 is conformally deposited onto surface 206. In other cases, layer 302 may not be conformably deposited. In some embodiments, a conformally-deposited layer exhibits a step coverage equal to or greater than 20%, or greater than 80%, or greater than 90%, or greater than 100%, or greater than 110%, or greater than 150%, or greater than 200%, in/on structures having aspect ratios (height/width) of more than about 2, more than about 5, more than about 10, more than about 25, more than about 50, more than about 100, or between about 10 and 100 or about 5 and about 25. It shall be understood that the term "step coverage" refers to a thickness of a layer on a distal surface of a recess, divided by the thickness of that layer on a proximal surface of the recess, and is expressed as a percentage. As noted above, the distal portion of the gap feature refers to a portion of the gap feature that is relatively far removed from a substrate's surface, and that the proximal portion of a gap feature refers to a part of the gap feature which is closer to the substrate's surface compared to the distal/lower/deeper portion of the gap feature.

In some cases, at least some of soluble layer 302 forms within gap 204. Having at least a portion of soluble layer 302 form within gap 204 during step 104 may be desirable to facilitate filling gap 204 in a void-free manner during or upon completion of step 106. Having at least a portion of soluble layer 302 form within gap 204 during step 104 may also be desirable to facilitate obtaining desired material properties after step 106, 108, and/or 110. In the illustrated example, soluble layer 302 may initially form with a void 304, which may be removed during or after step 106.

During step 106, the soluble layer (e.g., soluble layer 302) is exposed to a solvent to thereby form solvated material within the gap. FIG. 4 illustrates a structure 400, where soluble layer 302 has been exposed to a solvent to form solvated material 402 within the gap 204. Various vapor-phase solvents can be used in accordance with examples of the disclosure. Exemplary solvents include water, $H_2O_2$, a polyol compound (e.g., a C3-C6 polyol, such as glycerol), an alkyl alcohol (e.g., a C1-C6 alkyl alcohol, such as methanol or ethanol), a carboxylic acid compound, (e.g., methyl acetate), an ether (e.g., a C2-C6 ether, such as an alkyl ether—e.g., dimethylether and diethylether or a C3-C6 cyclic ether, such as tetrahydrofuran), a ketone (e.g., a C2-C6 ketone, such as acetone), an organic nitrile (e.g., a C2-C6 organic nitrile, such as acetonitrile), an aldehyde (e.g., a C2-C6 aldehyde, such as dimethylformamide), an aromatic compound (e.g., C6-C10 aromatic compound, such as toluene), an organosulfur compound (e.g., dimethylsulfoxide), an acetate (e.g., a C2-C6 acetate, such as ethyl acetate), a hydrocarbon (e.g., a C3-C8 hydrocarbon, such as hexane or heptane) and an organohalo compound (e.g., an organochloro compound, such as dichloromethane). In the case of water, for example, a substrate temperature can be between about 25° C. and about 95° C. or about 90° C. and about 95° C. during step 106. A pressure within a reaction chamber during step 106 can be between about 1 and about 760 torr or about 10 and about 100 torr.

In some cases, step 106 can be performed in the same reaction chamber used during step 104. Or, step 106 can be performed within the same reactor system or module used during step 104.

In accordance with further examples of the disclosure, step 106 of exposing the soluble layer to the solvent comprises pulsing the solvent to the reaction chamber. For example, the solvent can be pulsed to the reaction chamber for pulse periods of about 0.1 to about 5 or about 5 to about 300 seconds. A flowrate of the solvent to the reaction chamber can be between about 10 and about 1000 or about 1000 and about 10000 sccm.

During step 108, solvent is removed to form solvated material (e.g., solvated material 402) to form dried material. Step 108 can be performed using any suitable method. For example, step 108 can include increasing a temperature of the substrate. In these cases, a temperature of the substrate can be ramped up at a relatively low rate—e.g., at a rate between about 1 and about 100° C./min. Additionally or alternatively, step 108 can include decreasing a pressure within the reaction chamber. For example, step 108 can include ramping the pressure within the reaction chamber at a rate between about −100 and about −10000 Pa/min.

FIG. 5 illustrates a structure 500, including dried material 502. Dried material can be or include the same material as soluble layer 302. As illustrated in FIG. 5, dried material can be void-free and seam free.

With reference again to FIG. 1, method 100 can include a step of exposing the dried material to a converting reactant to form converted material. The converting reactant can be or include one or more of a nitriding reactant, an oxidizing reactant, and a reducing reactant. The converting reactant can include species that are thermally and/or plasma activated (e.g., using a remote, direct, or indirect plasma). By way of examples, suitable nitriding reactants include $N_2$, $NH_3$, $N_2H_2$, and cyanide salt, such as an alkali metal cyanide salt and/or activated species formed therefrom; suitable oxidizing reactants include $H_2O$, $H_2O_2$, $O_3$, $O_2$, $CO_2$, $NO_2$, $N_2O_4$ and/or activated species formed therefrom; and suitable reducing reactants include $H_2$, $NaAlH_2(OCH_2CH_2OCH_3)_2$, $LiAlH_4$ and/or activated species formed therefrom.

FIG. 6 illustrated a structure 600 including converted material 602. Converted material 602 can include a metal from soluble layer 302 and one or more of nitrogen and oxygen. Or, converted material can substantially comprise the metal.

Figure 7:
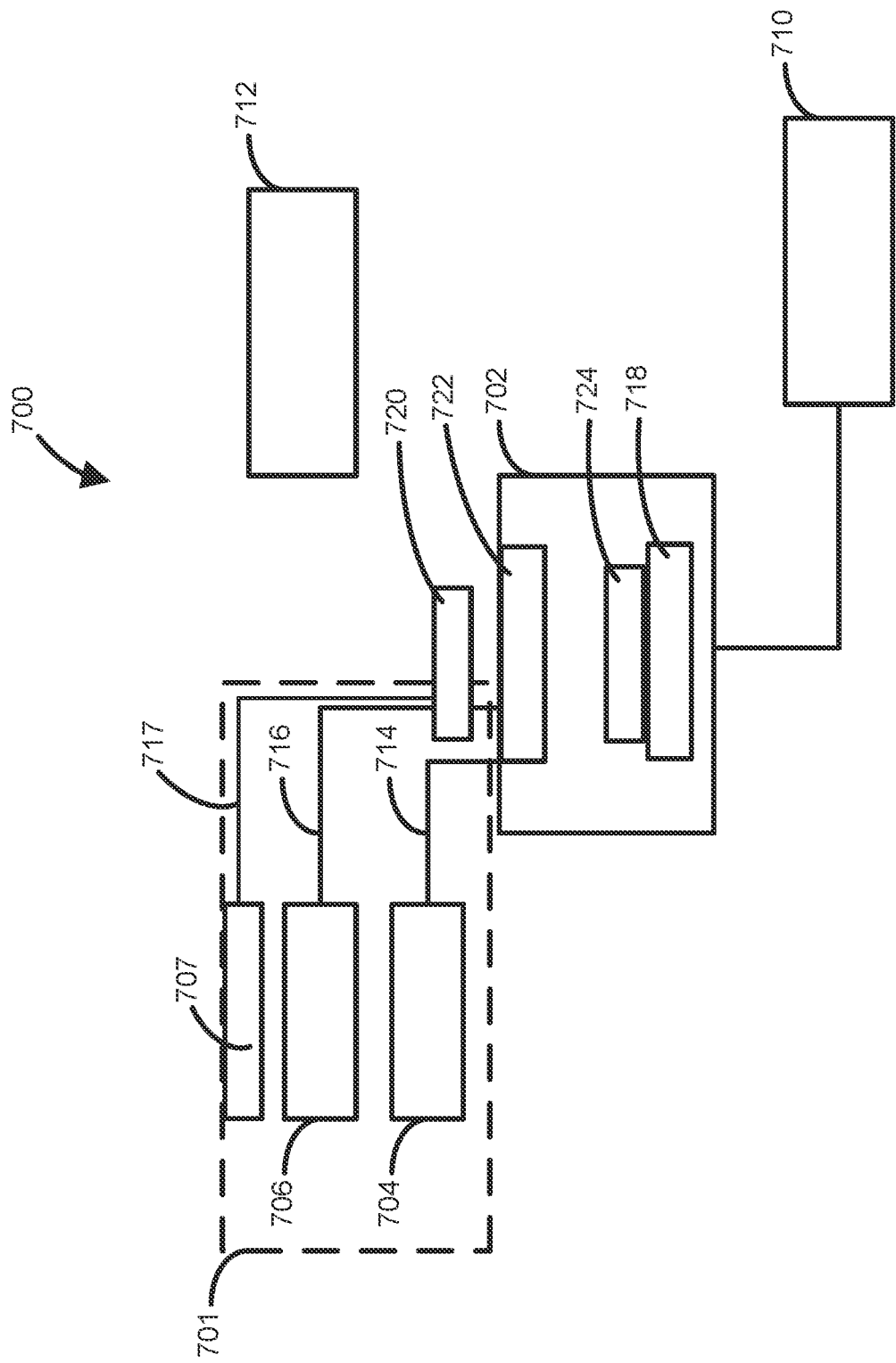
FIG. 7 illustrates a reactor system in accordance with examples of the disclosure.

FIG. 7 schematically illustrates a reactor system 700 according to examples of the disclosure. Reactor system 700 can be used to perform a method as described herein and/or to form a layer or a structure or a portion thereof as described herein.

In the illustrated example, reactor system 700 includes one or more reaction chambers 702, a precursor injector system 701, a precursor vessel 704, a noble gas vessel 706, solvent source 707, an exhaust source 710, a controller 712, and a susceptor 714. Reactor system 700 can also include a direct and/or indirect plasma apparatus 722 and/or a remote plasma apparatus 720. Reactor system 700 may comprise one or more additional gas sources (e.g., a converting reactant), an inert gas source, a carrier gas source, a purge gas source, and/or the like.

Reaction chamber 702 can include any suitable reaction chamber, such as an ALD or CVD reaction chamber. For example, reaction chamber 702 can form part of a PECVD or PEALD reactor system.

Precursor vessel 704 can include a vessel and one or more soluble layer precursors as described herein—alone or mixed with one or more carrier (e.g., inert or noble) gases. Vessel 706 can include, for example, one or more noble gases. Vessel 707 can include one or more solvents, such as those noted herein. Although illustrated with three source vessels 704, 706, and 707, reactor system 700 can include any suitable number of source vessels. Source vessels 704, 706, and 707 can be coupled to reaction chamber 702 via lines 714, 716, and 717, which can each include flow controllers, valves, heaters, and the like. In some embodiments, the precursor in precursor vessel 704, gas in vessel 706, and/or solvent in vessel 707 is heated. For example, the solvent can be heated to a temperature within about ±ten or five degrees of a solvent boiling temperature.

Exhaust source 710 can include one or more vacuum pumps.

Controller 712 includes electronic circuitry and software to selectively operate valves, manifolds, heaters, pumps and other components included in reactor system 700. Such circuitry and components operate to introduce precursors, reactants, solvents, and the like from their respective sources. Controller 712 can control timing of gas pulse sequences, temperature of the substrate and/or reaction chamber 702, pressure within the reaction chamber 702, and various other operations to provide proper operation of reactor system 700. Controller 712 can include control software to electrically or pneumatically control valves to control flow of precursors, reactants and purge gases into and out of the reaction chamber 702. Controller 712 can include modules, such as a software or hardware component, which performs certain tasks. A module may be configured to reside on the addressable storage medium of the control system and be configured to execute one or more processes. In accordance with examples of the disclosure, controller 712 is configured to deposit a soluble layer on a surface of a substrate and expose the soluble layer to a solvent to form solvated material.

Other configurations of reactor system 700 are possible, including different numbers and kinds of precursor and reactant sources, as well as other reactor designs (e.g., PVD). Further, it will be appreciated that there are many arrangements of valves, conduits, precursor sources, and auxiliary reactant sources that may be used to accomplish a method as set forth herein. Further, as a schematic representation of a deposition assembly, many components have been omitted for simplicity of illustration, and such components may include, for example, various valves, manifolds, purifiers, heaters, containers, vents, and/or bypasses.

During operation of reactor system 700, substrates, such as substrate 724, can be transferred from, e.g., a substrate handling system to reaction chamber 702. Once substrate(s) 724 are transferred to reaction chamber 702, one or more gases from gas sources, such as precursors, reactants, and the like, are introduced into reaction chamber 702. Or another deposition process may be started.

In some cases, controller 712 can be configured to evaporate solvent from the solvated material to form dried material. In these cases, controller 712 can be configured to ramp a temperature of susceptor 718 and/or decrease a temperature within reaction chamber 702 as described herein.

In accordance with additional or alternative examples, controller 712 is configured to expose the dried material to one or more of a nitriding reactant, an oxidizing reactant, and a reducing reactant as described above.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming material within a gap on a surface of a substrate, the method comprising the steps of:
    providing the substrate within a reaction chamber of a reactor;
    depositing a soluble layer on the surface of the substrate; and
    after the step of depositing, exposing the soluble layer to a solvent to thereby form solvated material within the gap.
2. The method of claim 1, further comprising a step of removing solvent from the solvated material to form dried material.

3. The method of claim 2, wherein the step of removing solvent comprises increasing a temperature of the substrate.

4. The method of claim 3, wherein the step of increasing the temperature comprises ramping the temperature of the substrate at a rate between about 1 and about 100° C./min.

5. The method of claim 2, wherein the step of removing solvent comprises decreasing a pressure within the reaction chamber.

6. The method of claim 5, wherein the step of decreasing the pressure comprises ramping the pressure within the reaction chamber at a rate between about negative 100 and about negative 10000 Pa/min.

7. The method of claim 2, further comprising a step of exposing the dried material to a converting reactant to form converted material.

8. The method of claim 7, wherein the converting reactant comprises one or more of a nitriding reactant, an oxidizing reactant, and a reducing reactant.

9. The method of claim 1, wherein the soluble layer comprises a halogen.

10. The method of claim 1, wherein the soluble layer comprises a metal halide.

11. The method of claim 10, wherein the metal is selected from a group 1 to group 12 metal.

12. The method of claim 10, wherein the metal is selected from one or more of iridium, strontium, cobalt, lithium, praseodymium, and zinc.

13. The method of claim 1, wherein the soluble layer comprises $IrCl_4$, $SrI_2$, $CoBr_2$, $LiCl$, $LiBr$, $PrCl_3$, or $ZnCl_2$.

14. The method of claim 1, wherein the step of depositing the soluble layer comprises PECVD, pulsed PECVD, ALD, PEALD, CVD, LPCVD, vacuum thermal evaporation, electron beam evaporation, laser beam evaporation, arc evaporation, molecular beam epitaxy, ion plating evaporation, direct current sputtering (DC sputtering), radio frequency sputtering (RF sputtering), sol-gel technique, chemical bath deposition, spray pyrolysis technique or plating.

15. The method of claim 1, wherein the step of depositing the soluble layer comprises providing a precursor comprising soluble layer material to the reaction chamber.

16. The method of claim 1, wherein the step of exposing the soluble layer to the solvent comprises pulsing the solvent to the reaction chamber.

17. The method of claim 1, wherein the step of exposing the soluble layer to the solvent is performed within the reaction chamber.

18. The method of claim 1, wherein a mass part of solvent require to dissolve 1 mass part of the solute is lower than 1000 at the substrate temperature and a pressure within the reaction chamber.

19. The method of claim 1, wherein the solvent is selected from the group consisting of water, $H_2O_2$, a polyol compound, an alkyl alcohol (e.g., a C1-C6 alkyl alcohol, a carboxylic acid compound, an ether, a ketone, an organic nitrile, an aldehyde, an aromatic compound, an organosulfur compound, an acetate, a hydrocarbon, and an organohalo compound.

20. A reactor system for performing the method of claim 1.

* * * * *